_United States Patent_ [19]

Saikawa et al.

[11] Patent Number: 4,621,041

[45] Date of Patent: * Nov. 4, 1986

[54] LITHOGRAPHIC PRINTING PLATE

[75] Inventors: Masahiko Saikawa, Nagoya; Eiji Kanada; Kazunaka Endo, both of Nagaokakyo, all of Japan

[73] Assignee: Mitsubishi Paper Mills, Ltd., Tokyo, Japan

[ * ] Notice: The portion of the term of this patent subsequent to Feb. 26, 2002 has been disclaimed.

[21] Appl. No.: 629,971

[22] Filed: Jul. 11, 1984

[30] Foreign Application Priority Data

Jul. 14, 1983 [JP] Japan ................... 58-128217

[51] Int. Cl.$^4$ .................. G03C 5/54; G03C 1/02; G03C 1/06; G03F 7/02
[52] U.S. Cl. ..................... 430/204; 430/302; 430/347; 430/494; 430/567; 430/569; 430/581; 430/585; 430/588; 430/604; 430/605
[58] Field of Search ............ 430/204, 205, 264, 605, 430/300, 309, 569, 604, 302, 230, 244, 246, 247, 945, 347, 363, 585, 588, 567, 581, 494

[56] References Cited

U.S. PATENT DOCUMENTS

| | | | |
|---|---|---|---|
| 3,890,154 | 6/1975 | Ohkubo et al. | 430/494 |
| 4,126,472 | 11/1978 | Sakai et al. | 430/264 |
| 4,134,769 | 1/1979 | Yoshida et al. | 430/204 |
| B1 4,134,769 | 11/1983 | Yoshida et al. | 430/204 |
| 4,173,483 | 11/1979 | Habu et al. | 430/603 |
| 4,288,535 | 9/1981 | Kanisawa et al. | 430/605 |
| 4,469,783 | 9/1984 | Kuwabara et al. | 430/605 |
| 4,495,274 | 1/1985 | Yoshida | 430/605 |
| 4,501,811 | 2/1985 | Saikawa et al. | 430/230 |

_Primary Examiner_—Mary F. Downey
_Attorney, Agent, or Firm_—Cushman, Darby & Cushman

[57] ABSTRACT

Disclosed is a method for plate-making which comprises imagewise exposing by scanning type flash exposure a lithographic printing plate comprising a support and at least a silver halide emulsion layer containing at least 70 mol % of silver chloride and prepared with addition of a water soluble iridium compound during emulsification or physical ripening of silver halide and a water soluble gold compound at any time before coating of the emulsion and thereafter subjecting the exposed emulsion to diffusion transfer development.

17 Claims, No Drawings

LITHOGRAPHIC PRINTING PLATE

BACKGROUND OF THE INVENTION

This invention relates to a method for producing lithographic printing plates for plate-making by silver complex diffusion transfer process, which involves the scanning exposure technique to achieve high intensity short time exposure. It also relates to plate-making and printing methods using such lithographic printing plates.

Lithographic printing plates according to which the transfer silver images obtained by silver complex diffusion transfer process can be directly utilized as ink receptive areas are well known, for example, in Japanese Patent Publication (Kokoku) No. 30562/73, Japanese Patent Laid-Open Application (Kokai) Nos. 21602/78, 103104/79 and 9750/81.

According to a typical silver complex diffusion transfer process suitable for plate-making with such lithographic printing plates, a photosensitive material comprising a support and a subbing layer which also serves as antihalation layer, a silver halide emulsion layer and a physical development nuclei layer which are provided on the support is subjected to imagewise exposure and development treatment to convert silver halide of latent image areas to black silver in the emulsion layer. Simultaneously, silver halide of other than latent image areas dissolves with a silver halide complexing agent contained in the development processing solution and diffuses to the surface of the photosensitive material. The silver complex thus dissolved and diffused is precipitated on the physical development nuclei in the surface layer by the reducing action of developing agents. In order to increase the ink-receptivity of thus obtained silver images, if necessary, sensitizing treatment is conducted after the development treatment. Thereafter, the lithographic printing plate is set in an offset press and transfer of inked images to print materials is carried out.

According to the conventional methods, the silver halide emulsion layer is spectrally sensitized with merocyanine dyes, cyanine dyes and the like so that it has a sensitivity maximum at around 550 nm in the green area and this emulsion layer is subjected to exposure of several seconds to several ten seconds in a process camera having a normal light source such as tungsten light source.

A printing plate obtained in such a way, however, exhibited only limited sharpness and resolving power, even though an aforementioned lithographic printing plates inherently excellent in these properties has been used. Moreover, in reproducing a color print from a color original, the conventional process has disadvantages in that both procedures of preparing the lithographic printing plates and plate-making are troublesome in addition to the insufficient resolving power.

At present, for solving said problems there are considered direct plate-making methods by conducting a scanning type flash exposure at markedly high intensity and for a short period of time ($10^{-5}$ seconds or less) with various laser beams such as neon-helium laser beam, light-emitting diodes (LED), cathode ray tubes (CRT). However, it is known that such exposing method causes the so-called high intensity reciprocity law failure which results in reduction of sensitivity and gradation. There are proposed many methods to prevent such reciprocity law failure. However, in the case of the sensitivity expressed by exposure required for forming ink-receptive transfer silver, only such sensitivity as utterly insufficient for the light sources such as LED of low output can be obtained and moreover printing characteristics are often lowered, e.g., to cause scumming. In order to provide high sensitivity to such exposing light sources as mentioned above, sensitizing dyes in conformity to the emission maximum wavelength of the light sources must be used.

Japanese Patent Laid-Open Application (Kokai) No. 21601/78 (U.S. Pat. No. 4,134,769) discloses use of betaine type or anion type cyanine sensitizing dyes to obtain offset printing plates of high sensitivity and improved in printabilities and it further shows that it is preferred for obtaining high sensitivity to use silver halide emulsions high in silver bromide content.

On the other hand, it is known that in the case of a high-intensity short-time exposure, silver halide emulsions high in silver chloride content are inferior in spectral sensitization effect to those low in silver chloride content (see, e.g., Japanese Patent Publication (Kokoku) No. 42172/73) and moreover the former is more susceptible to high-intensity reciprocity law failure than the latter (e.g., "Photographic Science and Engineering", Vol 26, 1982). Thus, generally silver halide emulsions high in silver chloride content can be said to be unsuitable as emulsions for scanning type high-intensity and short-period exposure.

As a result of the inventors' intensive researches on lithographic printing plates using silver complex diffusion transfer process which employs the light sources as mentioned hereinbefore, it has been found that emulsions higher in silver chloride content can provide lithographic printing plates higher in sensitivity and superior in printing characteristics.

SUMMARY OF THE INVENTION

Accordingly, it is an object of this invention to provide lithographic printing plates for plate-making by silver complex diffusion transfer process which are highly sensitive to scanning type flash exposure and which have excellent printing characteristics.

The above object of this invention has been attained by lithographic printing plates which utilizes silver complex diffusion transfer process using scanning flash exposure, characterized in that the lithographic printing plates have a silver halide emulsion layer which contains a water soluble gold compound and at least 70 mol % of silver chloride and further contains a water soluble iridium compound added during emulsification or physical ripening.

DESCRIPTION OF THE INVENTION

Japanese Patent Publication (Kokoku) No. 32738/70 discloses addition of $10^{-8}$–$10^{-5}$ mol of a water soluble iridium compound per 1 mol of silver halide during emulsification or physical ripening of the emulsion and addition of $10^{-6}$–$10^{-2}$ mol of a water soluble gold compound during emulsification, physical ripening or second ripening, thereby to improve characteristics to flash exposure such as xenon flash exposure. However, it is seen from the results of its Examples that these emulsions are generally not increased in sensitivity over those containing only the gold compound and even when the sensitivity is increased, the increment is slight. In order to perform direct plate making using such light sources as mentioned above, the higher sensitivity is required and especially with LED having output smaller than neon-helium laser beam a big increase in sensitivity is necessary and besides printing characteristics must also be good.

According to this invention, it has been found that emulsions higher in silver chloride content (namely, considering silver chloride emulsion to have the maximum sensitivity) exhibit extremely remarkable sensitizing effect by addition of iridium compound and have the sensitivity which makes it possible to use even the light sources of small output and besides solve the problems in printabilities such as scumming.

Content of silver chloride is at least 70 mol %, preferably at least 80 mol %.

As the water soluble iridium compounds, various compounds may be used and representatives are iridium chloride ($IrCl_3$ and $IrCl_4$), hexahalogenoiridic acid (III) or salts thereof, hexahalogenoiridic acid (IV) or salts thereof, etc. Amount of the water soluble iridium compounds added is within the range of $10^{-8}$ to $10^{-4}$ mol per one mol of silver halide and they are added during emulsification of silver halide or physical ripening of the emulsion.

As examples of the gold compounds used in this invention, mention may be made of chloroauric acid ($HAuCl_4$), potassium chloroaurate ($KAuCl_4$), auric trichloride ($AuCl_3$), potassium auric thiocyanate $[KAu(CNS)_4]$, potassium iodoaurate ($KAuI_4$), ammonium aurothiocyanate $[NH_4Au(CNS)_2]$, etc. The gold compounds may be added at any stage before coating, namely, during emulsification, physical ripening or chemical ripening and may also be added even after the chemical ripening. Amount of the gold compound added may be $10^{-6}$ to $10^{-2}$ mol per one mol of silver halide.

The silver halide emulsions used in this invention are silver halides containing at least 70 mol % of silver chloride, preferably at least 80 mol % such as silver chloride, silver chlorobromide, silver chlorobromoiodide containing 0.1 to 2 mols of silver iodide. Average grain size of silver halide grains is preferably 0.2 to 0.6μ but those outside this range may also be used. Moreover, the silver halide emulsion is preferably monodispersed emulsion in which at least 90% of total grains have a grain size within the range of ±30% of the average grain size. Furthermore, silver halide grains are preferably cubical grains or tetradecahedron grains, but those of other crystal habits may also be used.

Binders used for the silver halide emulsion in the lithographic printing plates of this invention are generally gelatin which can be partially replaced with one or more of hydrophilic polymeric binders such as starch, albumin, sodium alginate, hydroxyethyl cellulose, gum arabic, polyvinyl alcohol, polyvinyl pyrrolidone, carboxymethyl cellulose, polyacrylamide, styrene-maleic anhydride copolymer, polyvinylmethyl ether-maleic anhydride copolymer. Vinyl polymer aqueous dispersion (latex) may also be used.

Salts of cobalt, nickel, rhodium, palladium, platinum, etc. may be used at optional stages during production of silver halide emulsions.

Spectral sensitizing dyes in conformity with the wavelength of light sources used may be used in the silver halide emulsions. Preferred are betaine type or anion type cyanine sensitizing dyes as mentioned in U.S. Pat. No. 4,134,769 and representatives thereof are as shown by the following general formula (I):

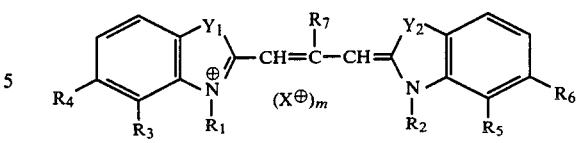

(wherein $R_1$ and $R_2$ each represents alkyl groups (e.g., methyl, ethyl, propyl, butyl, β-sulfoethyl, γ-sulfopropyl, γ-sulfobutyl, vinylmethyl, β-carboxyethyl, γ-carboxypropyl, δ-carboxybutyl, etc.), alkenyl groups, aryl groups or aralkyl groups, at least one of $R_1$ and $R_2$ being substituted alkyl group having sulfo or carboxyl group, $R_3$ to $R_6$ represent hydrogen atom, alkyl groups, alkoxy groups, aryl groups, hydroxyl group, alkoxycarbonyl groups or halogen atoms, $R_3$ and $R_4$ or $R_5$ and $R_6$ may jointly form a benzene ring, $R_7$ represents an alkyl group, aryl group or aralkyl group, $Y_1$ and $Y_2$ each represents O atom, S atom, Se atom or N-$R_8$ wherein $R_8$ is a lower alkyl group, X represents a cation such as hydrogen, an alkali metal or ammonium, and m represents 1 or 0).

Typical examples of the sensitizing dyes used in this invention are shown below:

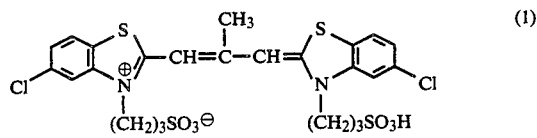

(1)

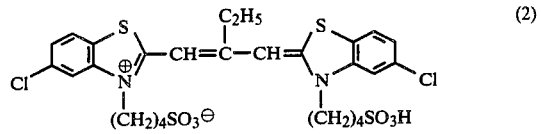

(2)

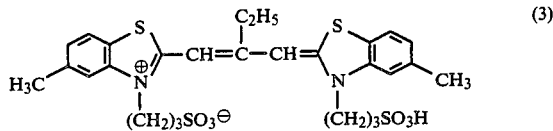

(3)

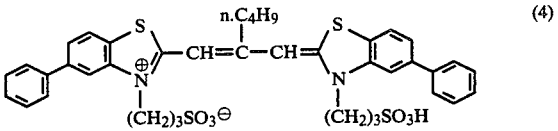

(4)

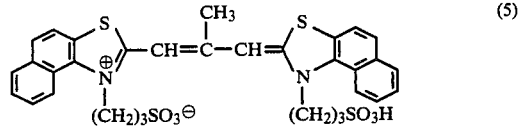

(5)

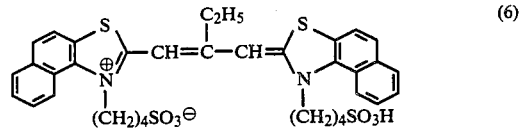

(6)

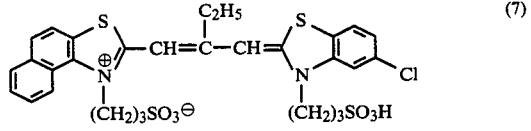

(7)

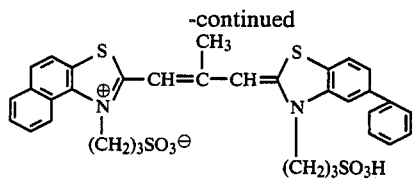

The sensitizing dyes used in this invention may be synthesized by the methods known to those skilled in the art. The sensitizing dyes may be added to the silver halide emulsions at any time before coating the emulsion. Amount of the dyes added may be widely varied, but the range of $1 \times 10^{-5}$ to $1 \times 10^{-2}$ mol per one mol of silver halide provides good results. The optimum addition amount varies depending on the conditions of silver halide emulsions, e.g., composition of halogen, average size of silver halide grains, the crystal habit, etc. The silver halide emulsion layer may contain other ordinary additives such as coating assistants, antifoggants, hardeners, matting agents (water-retaining agent), developing agents, etc.

Under the silver halide emulsion layer (on the support side), a subbing layer for improvement of adhesion and/or an undercoat layer for prevention of halation may be provided and these layers may contain a developer and a matting agent.

The lithographic printing plates of this invention have an image receiving layer which contains physical development nuclei. As the physical development nuclei, there may be used metals such as antimony, bismuth, cadmium, cobalt, palladium, nickel, silver, lead, zinc, etc. and sulfides of these metals which are known as the nuclei. The image receiving layer may not contain hydrophilic colloid, but may contain hydrophilic colloids such as gelatin, carboxymethyl cellulose, gum arabic, sodium alginate, hydroxyethyl starch, dextrin, hydroxyethyl cellulose, polystyrenesulfonic acid, a copolymer of vinylimidazole and acrylamide, polyvinyl alcohol, etc., preferably in an amount of 0.1 g/m² or less.

The image receiving layer may contain hygroscopic substances, e.g., wetting agents such as sorbitol, glycerol, etc. The image receiving layer may further contain pigments for prevention of scumming such as barium sulfate, titanium dioxide, china clay and silver, developing agents such as hydroquinone and hardeners such as formaldehyde.

The supports used in this invention can be, e.g., paper; films such as cellulose acetate film, polyvinylacetal film, polystyrene film, polypropylene film, polyethylene terephthalate film and composite films of polyester, polypropylene or polystyrene films covered with polyethylene films; metals; metallized paper or metal/paper laminates. Paper supports one side or both sides of which are coated with α-olefin polymers, e.g., polyethylene may also be used. These supports may contain antihalation dyes or pigments.

The DTR processing solutions used in this invention may contain alkaline substances, e.g., sodium hydroxide, potassium hydroxide, lithium hydroxide, trisodium phosphate; sulfites as preservatives; silver halide solvents, e.g., thiosulfates, thiocyanates, cyclic imide compounds, thiosalicyclic acid, amines, etc.; thickeners, e.g., hydroxyethyl cellulose, carboxymethyl cellulose; antifoggants, e.g., potassium bromide, 1-phenyl-5-mercaptotetrazole, compounds mentioned in Japanese Patent Laid-Open Application (Kokai) No. 26201/72; developing agents, e.g., hydroquinone, 1-phenyl-3-pyrazolidone; development modifiers, e.g., polyoxyalkylene compounds, onium compounds, etc.

In carrying out the silver complex diffusion transfer process, the developing agent is incorporated into silver halide emulsion layer and/or image receiving layer or other water permeable layers adjacent thereto as described in British Pat. Nos. 1,000,115, 1,012,476, 1,017,273 and 1,042,477. Therefore, in the case of such materials, the processing solutions used at developing stage can be the so-called "alkaline activating solution" containing no developer.

The lithographic printing plates made according to this invention can be made ink receptive or augumented in ink receptivity with compounds as disclosed, for example, in U.S. Pat. No. 3,721,539.

Printing can be performed in a known manner using common etch solutions and common fountain solutions.

The invention is illustrated below with reference to Examples, but the invention is not limited thereto.

EXAMPLE 1

On one side of a subbed polyester film support was provided a matting layer containing silica particles of 5μ in average size and on the opposite side of the support were provided an antihalation undercoat layer (adjusted to pH 4.0) containing carbon black and 20% by weight (per photographic gelatin) of silica powders of 7 μm in average size and a spectrally sensitized high speed silver chloride emulsion layer (adjusted to pH 4.0) containing 5% by weight (per photographic gelatin) of silica powders of 7 μm in average size after chemical sensitization.

Gelatin in the undercoat layer was in an amount of 3.0 g/m² and gelatin in the emulsion layer was in an amount of 1.0 g/m² and silver halide in terms of silver nitrate in the emulsion layer was in an amount of 1.0 g/m². These undercoat layer and emulsion layer contained formalin as a hardener in an amount of 5.0 mg/g per gelatin, respectively. After drying at 40° C. for 14 days, on the emulsion layer was coated the nuclei coating solution described in Example 2 of U.S. Pat. No. 4,160,670 (wherein as the polymer was used polymer No. 3 acrylamide-imidazole copolymer and hydroquinone was contained in an amount of 0.8 g/m²) and was dried to obtain a lithographic printing plate. The silver halide emulsion contained rhodium chloride in an amount of $5 \times 10^{-6}$ mol per one mol of silver halide which had been added at the time of physical ripening and the silver halide was substantially in the form of cubical crystals having an average grain size of 0.45μ and at least 90% of all grains were distributed within the range of ±30% of the average size.

Chemical sensitization was made with sodium thiosulfate in an amount of $3 \times 10^{-5}$ mol per one mol of silver halide and HAuCl₄ in an amount of $4 \times 10^{-5}$ mol. As the spectral sensitizating dye, dye No. 2 mentioned hereinabove was used in an amount of $3 \times 10^{-4}$ mol per one mol of silver halide. Thus obtained sample was called Comparative Sample A.

Samples as shown in the following Table were prepared in the same manner as above except that composition of silver halide was changed and/or potassium hexachloroiridate (IV) was added in an amount of $3 \times 10^{-6}$ mol per one mol of silver halide at the time of mixing (emulsification) of the silver halides.

|  | AgCl | AgBr | Iridium |
|---|---|---|---|
| Comparative Sample A | 100 | 0 | Absent |
| Comparative Sample B | 90 | 10 | Absent |
| Comparative Sample C | 50 | 50 | Absent |
| Sample of this invention D | 100 | 0 | Present |
| Sample of this invention E | 90 | 10 | Present |
| Comparative Sample F | 50 | 50 | Present |

These samples were exposed for $10^{-5}$ second to the beam from a neon-helium laser device (DIRECT SCANNER-GRAPH SG-606 manufactured by DAINIPPON SCREEN MFG. CO., LTD.) through a contact screen (made by DAINIPPON SCREEN MFG. CO., LTD.) in close contact with the samples using a neutral gray wedge.

After exposure, these sample lithographic printing plates were developed with the following diffusion transfer developing solution:

| Transfer developing solution | |
|---|---|
| Water | 700 ml |
| Potassium hydroxide | 20 g |
| Anhydrous sodium sulfite | 50 g |
| α-Mercaptobenzoic acid | 1.5 g |
| α-Methylaminoethanol | 15 g |
| Water to make up to | 1 l |

After the development, these plates were passed through a pair of squeeze rollers to remove the excess developing solution and immediately treated with a neutralizing solution of the following composition at 25° C. for 20 seconds. After removal of an excess of the solution by the squeeze rollers, the plates were dried at room temperature.

| Neutralizing solution: | |
|---|---|
| Water | 600 ml |
| Citric acid | 10 g |
| Sodium citrate | 35 g |
| Colloidal silica (20% suspension) | 5 ml |
| Ethylene glycol | 5 ml |
| Water to make up to | 1 l |

Sensitivity, sharpness and resolving power of each lithographic printing plate are shown in Table 1.

The sensitivity was expressed by exposure required before the precipitation of the transfer silver had no more been observed and by relative value taking that of Comparative Sample A as 100.

The sharpness and resolving power were evaluated by using gray contact screens of 100, 133, 150, 175 and 200 lines/inch and observing the maximum number of lines per inch which had permitted a definite and distinct reproduction of tiny dots (5% dot). The results were expressed by five grades of 1 (100 lines/inch)–5 (200 lines/inch).

Each plate made by using the contact screen which was employed for determining sharpness shown in Table 1 was mounted on an offset press and the plate surface was thoroughly supplied with the following etch solution. The printing was performed using the following fountain solution.

| Etch solution (Desensitizing solution): | |
|---|---|
| Water | 600 ml |
| Isopropyl alcohol | 400 ml |
| Ethylene glycol | 50 g |
| 3-Mercapto-4-acetamido-5-n-heptyl-1,2,4-triazole | 1 g |
| Fountain solution: | |
| Orthophosphoric acid | 10 g |
| Nickel nitrate | 5 g |
| Sodium sulfite | 5 g |
| Ethylene glycol | 100 g |
| Colloidal silica (20% suspension) | 28 g |
| Water to make up to | 2 l |

The printing press used was A. B. Dick 350CD (a trade name for an offset press manufactured by A. B. Dick Co.). Printing endurance of each plate was evaluated in terms of the number of copies delivered before the printing had become impossible owing to either formation of scumming (ground staining) or worn-off of silver and expressed in grade number rated in accordance with the following criteria. The results are also shown in Table 1, the right column.

| Grade No. | Number of copies |
|---|---|
| 1 | Less than 4,000 copies. |
| 2 | 4,000–6,000 copies. |
| 3 | 6,000–8,000 copies. |
| 4 | 8,000–10,000 copies. |
| 5 | More than 10,000 copies. |

TABLE 1

| Samples | Relative sensitivity | Sharpness | Printing Endurance |
|---|---|---|---|
| Comparative Sample A | 100 | 4 | 4 |
| Comparative Sample B | 170 | 3 | 3 |
| Comparative Sample C | 160 | 3 | 1 |
| Sample of this invention D | 830 | 5 | 5 |
| Sample of this invention E | 610 | 5 | 5 |
| Comparative Sample F | 200 | 4 | 2 |

It will be recognized from Table 1 that due to addition of iridium the lithographic printing plates of this invention, in spite of their high silver chloride content, had extremely higher sensitivity to neon-helium laser beam and higher printing endurance than the Comparative Samples A, B, C and F.

EXAMPLE 2

Lithographic printing plates (Samples A'-F') made in the same manner as in Example 1 except that the sensitizing dye (2) was replaced with sensitizing dye (6) were exposed by light emitting diode exposing device ($10^{-7}$ second). The results evaluated according to the methods of Example 1 are shown in Table 2.

TABLE 2

| Samples | Relative Sensitivity | Sharpness | Printing Endurance |
|---|---|---|---|
| Comparative Sample A' | 100 | 3 | 3 |
| Comparative Sample B' | 210 | 3 | 3 |
| Comparative Sample C' | 240 | 3 | 1 |
| Sample of this invention D' | 1100 | 5 | 5 |
| Sample of this invention E' | 890 | 5 | 5 |
| Comparative Sample F' | 250 | 3 | 2 |

It will be recognized that the similar results to those of Example 1 were obtained.

EXAMPLE 3

Six lithographic printing plates produced in the same manner as Example 1 except that the sensitizing dye (2) was replaced with the following dye were exposed by argon laser oscillating device ($10^{-5}$ second) and subjected to the same tests as in Example 1 to obtain similar results.

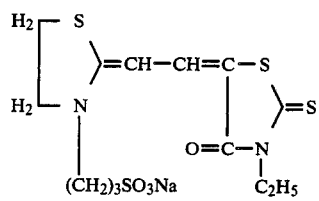

What is claimed is:

1. A method for plate-making which comprises image-wise exposing by scanning flash exposure a lithographic printing plate comprising a support, a physical development nuclei containing surface layer and at least an unfogged silver halide emulsion layer containing at least 70 mol % of silver chloride and prepared with addition of a water soluble iridium compound during emulsification or physical ripening of the emulsion and a water soluble gold compound at any time before coating of the emulsion and thereafter subjecting the exposed emulsion to diffusion transfer development.

2. A method according to claim 1 wherein the water soluble iridium compound is added during emulsification of the silver halide.

3. A method according to claim 1 wherein the water soluble iridium compound is added during physical ripening of the emulsion.

4. A method according to claim 1 wherein the water soluble iridium compound is added in an amount of $10^{-8}$–$10^{-4}$ mol per one mol of silver halide.

5. A method according to claim 1 wherein the water soluble gold compound is added in an amount of $10^{-6}$–$10^{-2}$ mol per one mol of silver halide.

6. A method according to claim 1 wherein the silver halide emulsion is selected from silver chloride, silver chlorobromide and silver chlorobromoiodide containing 0.1-2 mol of silver iodide.

7. A method according to claim 1 wherein the silver halide emulsion is a monodispersed emulsion where at least 90% of all silver halide grains have grain size within the range of ±30% of average grain size.

8. A method according to claim 1 wherein average grain size of the silver halide emulsion is 0.2-0.6μ.

9. A method according to claim 1 wherein the silver halide emulsion contains a betaine cyanine sensitizing dye.

10. A method according to claim 1 wherein the silver halide emulsion contains an anion cyanine sensitizing dye.

11. A method according to claim 1 wherein the scanning type exposure is performed by laser beam.

12. A method according to claim 1 wherein the scanning type exposure is performed by light-emitting diode.

13. A method according to claim 1 wherein the scanning type exposure is performed by cathode ray tube.

14. A method according to claim 1 wherein the water soluble iridium compound is iridium chloride, hexahalogenoiridic acid (III) or salts thereof or hexahalogenoiridic acid (IV) or salts thereof.

15. A method according to claim 1 wherein the water soluble gold compound is chloroauric acid, potassium chloroaurate, auric trichloride, potassium auric thiocyanate, potassium iodoaurate or ammonium aurothiocyanate.

16. A method according to claim 1 wherein the unfogged halide emulsion layer contains at least 80 mol % of silver chloride.

17. A method of printing which comprises printing in a printing machine with the lithographic printing plate made by image-wise exposing by scanning flash exposure a lithographic printing plate comprising a support, a physical developement nuclei containing surface layer and at least an unfogged silver halide emulsion layer containing at least 70 mol % of silver chloride and prepared with addition of a water soluble iridium compound during emulsification or physical ripening of the emulsion and a water soluble gold compound at any time before coating of the emulsion and thereafter subjecting the exposed emulsion of diffusion transfer development.

* * * * *

REEXAMINATION CERTIFICATE (2718th)

United States Patent [19]
Saikawa et al.

[11] B1 4,621,041
[45] Certificate Issued   * Nov. 7, 1995

[54] LITHOGRAPHIC PRINTING PLATE

[75] Inventors: Masahiko Saikawa, Nagoya; Eiji Kanada; Kazunaka Endo, both of Nagaokakyo, all of Japan

[73] Assignee: Mitsubishi Paper Mills, Ltd., Tokyo, Japan

Reexamination Request:
No. 90/003,473, Jun. 24, 1994

Reexamination Certificate for:
Patent No.: 4,621,041
Issued: Nov. 4, 1986
Appl. No.: 629,971
Filed: Jul. 11, 1984

[*] Notice: The portion of the term of this patent subsequent to Feb. 26, 2002, has been disclaimed.

[30] Foreign Application Priority Data

Jul. 14, 1983 [JP] Japan ................. 58-128217

[51] Int. Cl.[6] .................. G03C 8/06; G03C 1/035; G03C 1/09; G03F 7/07
[52] U.S. Cl. .............. 430/204; 430/230; 430/302; 430/347; 430/494; 430/567; 430/569; 430/581; 430/585; 430/588; 430/604; 430/605
[58] Field of Search ................ 430/204, 494, 430/230, 569, 604, 605, 588, 575, 302, 567, 246

[56] References Cited

U.S. PATENT DOCUMENTS

| | | | |
|---|---|---|---|
| 3,890,154 | 6/1975 | Ohkubo et al. | 430/494 |
| 4,134,769 | 11/1983 | Yoshida et al. | 430/204 |
| 4,160,670 | 7/1979 | Tsubai et al. | 430/204 |
| 4,288,535 | 9/1981 | Kanisawa et al. | 430/605 |
| 4,297,429 | 10/1981 | Kanada et al. | 430/204 |
| 4,336,321 | 6/1982 | Kanada et al. | 430/204 |
| 4,454,216 | 6/1984 | Horii et al. | 430/204 |
| 4,563,410 | 1/1986 | De Jaeger et al. | 430/204 |

FOREIGN PATENT DOCUMENTS 45-32738   10/1970   Japan.
49-33781   9/1974   Japan.

OTHER PUBLICATIONS

Faelens, P., "Some Aspects of the Reciprocity Law in Silver Chloride Emulsions, Part 1: High– and Low–Intensity Reciprocity Failure in Silver Chloride Emulsions", Photographic Science and Engineering (PSE), vol. 26, No. 2, pp. 100–105 (1982).

*Primary Examiner*—Richard L. Schilling

[57] ABSTRACT

Disclosed is a method for plate-making which comprises imagewise exposing by scanning type flash exposure a lithographic printing plate comprising a support and at least a silver halide emulsion layer containing at least 70 mol % of silver chloride and prepared with addition of a water soluble iridium compound during emulsification or physical ripening of silver halide and a water soluble gold compound at any time before coating of the emulsion and thereafter subjecting the exposed emulsion to diffusion transfer development.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–10 and 13–16 is confirmed.

Claims 11, 12 and 17 are determined to be patentable as amended.

11. A method [according to claim 1 wherein the scanning type exposure is performed] *for plate-making which comprises image-wise exposing* by laser beam *scanning exposure a lithographic printing plate comprising a support, a physical development nuclei containing surface layer and at least an unfogged silver halide emulsion layer containing at least 70 mol % of silver chloride and prepared with addition of a water soluble iridium compound during emulsification or physical ripening of the emulsion and a water soluble gold compound at any time before coating of the emulsion and thereafter subjecting the exposed emulsion to diffusion transfer development.*

12. A method [according to claim 1 wherein the scanning type exposure is performed] *for plate-making which comprises image-wise exposing* by light-emitting diode *scanning exposure a lithographic printing plate comprising a support, a physical development nuclei containing surface layer and at least an unfoggged silver halide emulsion layer containing at least 70 mol % of silver chloride and prepared with addition of a water soluble iridium compound during emulsification or physical ripening of the emulsion and a water soluble gold compound at any time before coating of the emulsion and thereafter subjecting the exposed emulsion to diffusion transfer development.*

17. A method of printing which comprises [printing in a printing machine with the lithographic printing plate made by]:

image-wise exposing by scanning flash exposure a lithographic printing plate comprising a support, a physical development nuclei containing surface layer and at least an unfogged silver halide emulsion layer containing at least 70 mol % of silver chloride and prepared with addition of a water soluble iridium compound during emulsification or physical ripening of the emulsion and a water soluble gold compound at any time before coating of the emulsion and thereafter subjecting the exposed emulsion [of] *to* diffusion transfer development; *and*

*printing in a printing machine.*

* * * * *